United States Patent
Lasiter et al.

(10) Patent No.: US 9,105,602 B2
(45) Date of Patent: Aug. 11, 2015

(54) EMBEDDED THREE-DIMENSIONAL CAPACITOR

(71) Applicant: QUALCOMM Incorporated, San Diego, CA (US)

(72) Inventors: Jon Bradley Lasiter, Stockton, CA (US); Ravindra Vaman Shenoy, Dublin, CA (US); Donald William Kidwell, Jr., Campbell, CA (US)

(73) Assignee: QUALCOMM Incorporated, San Diego, CA (US)

( * ) Notice: Subject to any disclaimer, the term of this patent is extended or adjusted under 35 U.S.C. 154(b) by 2 days.

(21) Appl. No.: 14/179,239

(22) Filed: Feb. 12, 2014

(65) Prior Publication Data

US 2015/0179731 A1    Jun. 25, 2015

Related U.S. Application Data

(60) Provisional application No. 61/920,419, filed on Dec. 23, 2013.

(51) Int. Cl.
*H01L 29/92* (2006.01)
*H01L 29/02* (2006.01)
*H01L 49/02* (2006.01)

(52) U.S. Cl.
CPC .................................... *H01L 28/40* (2013.01)

(58) Field of Classification Search
CPC ............................... H01L 29/92; H01L 21/02
USPC ........................................ 257/532; 438/386
See application file for complete search history.

(56) References Cited

U.S. PATENT DOCUMENTS

| | | | |
|---|---|---|---|
| 6,593,185 B1 | 7/2003 | Tsai et al. | |
| 6,765,255 B2 * | 7/2004 | Jin et al. | 257/301 |
| 7,115,935 B2 | 10/2006 | Tu et al. | |
| 7,199,001 B2 | 4/2007 | Wu et al. | |
| 2010/0052099 A1 * | 3/2010 | Chang et al. | 257/535 |
| 2011/0031586 A1 | 2/2011 | Kang et al. | |

* cited by examiner

*Primary Examiner* — Marc Armand
(74) *Attorney, Agent, or Firm* — Haynes and Boone, LLP

(57) ABSTRACT

An embedded capacitor is provided that includes a substrate having a dielectric-filled window. A metal-insulator-metal structure lines a plurality of vias extending through the dielectric-filled window and covers at least partially opposing sides of the dielectric-filled window.

20 Claims, 11 Drawing Sheets

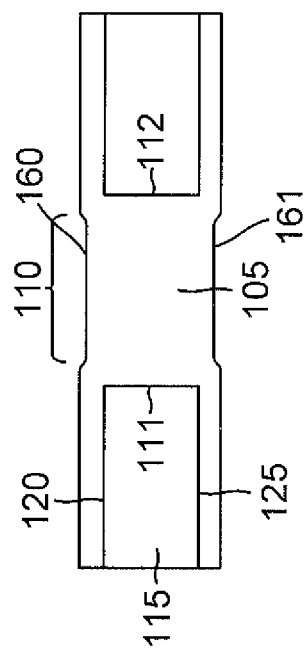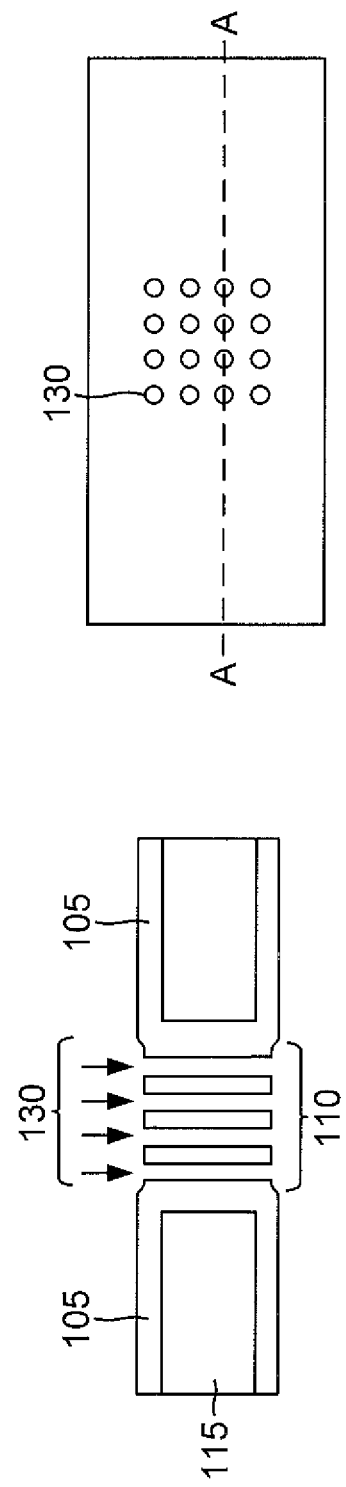

EMBEDDED THREE-DIMENSIONAL CAPACITOR

CROSS-REFERENCE TO RELATED APPLICATIONS

This application claims the benefit of U.S. Provisional Application No. 61/920,419, filed Dec. 23, 2013, the contents of which are hereby incorporated by reference in their entirety.

TECHNICAL FIELD

This application relates to embedded capacitors for an integrated circuit package.

BACKGROUND

The substrate thicknesses in modern semiconductor packages have continued to shrink so that mobile devices may have a thinner profile. In addition, system designers require a reduced surface-area footprint for the semiconductor packages. The need to integrate passive devices into a system is one issue that limits component density. In that regard, it is relatively straightforward to surface mount a discrete passive device such as a surface-mount (SMT) capacitor or inductor to a printed circuit board or package substrate. But such a mounting then demands more circuit board or substrate surface area and thus increases the overall footprint of the resulting electronic system. Another issue with surface mounting is that glass-based interposers and glass substrates have been increasingly used to support passive devices. Traditional mounting of SMT passive components onto glass raises reliability issues due to micro-cracks resulting in the glass from the associated drilling of holes and vias to support the surface mounting.

As an alternative, passive devices may be embedded within a cavity in the substrate. But to achieve thinner device profiles, substrates have been progressively thinned such as to no more than 200 microns. A typical embedded passive device has a height of at least 150 microns such that there is not sufficient room to embed such a device into a relatively-thin substrate.

Accordingly, there is a need in the art improved embedded passive devices.

SUMMARY

A substrate is provided that includes a dielectric material within a window extending through the substrate. The dielectric material includes a plurality of vias. The window in the substrate extends from a first side of the substrate to an opposing second side. A metal-insulator-metal structure lines the vias and also at least covers partially opposing surfaces of the dielectric material within the window.

BRIEF DESCRIPTION OF THE DRAWINGS

FIG. 5 is a cross-sectional view of the substrate of FIG. 4B after lamination of a dielectric material to fill the window.

FIG. 6A is a cross-sectional view of the substrate of FIG. 5 after vias are patterned in the dielectric material filling the window.

FIG. 6B is a plan view of the substrate of FIG. 5 showing a dotted line A-A along which the cross-sectional view of FIG. 5 was taken.

Embodiments of the present invention and their advantages are best understood by referring to the detailed description that follows. It should be appreciated that like reference numerals are used to identify like elements illustrated in one or more of the figures.

DETAILED DESCRIPTION

Figure 1A:
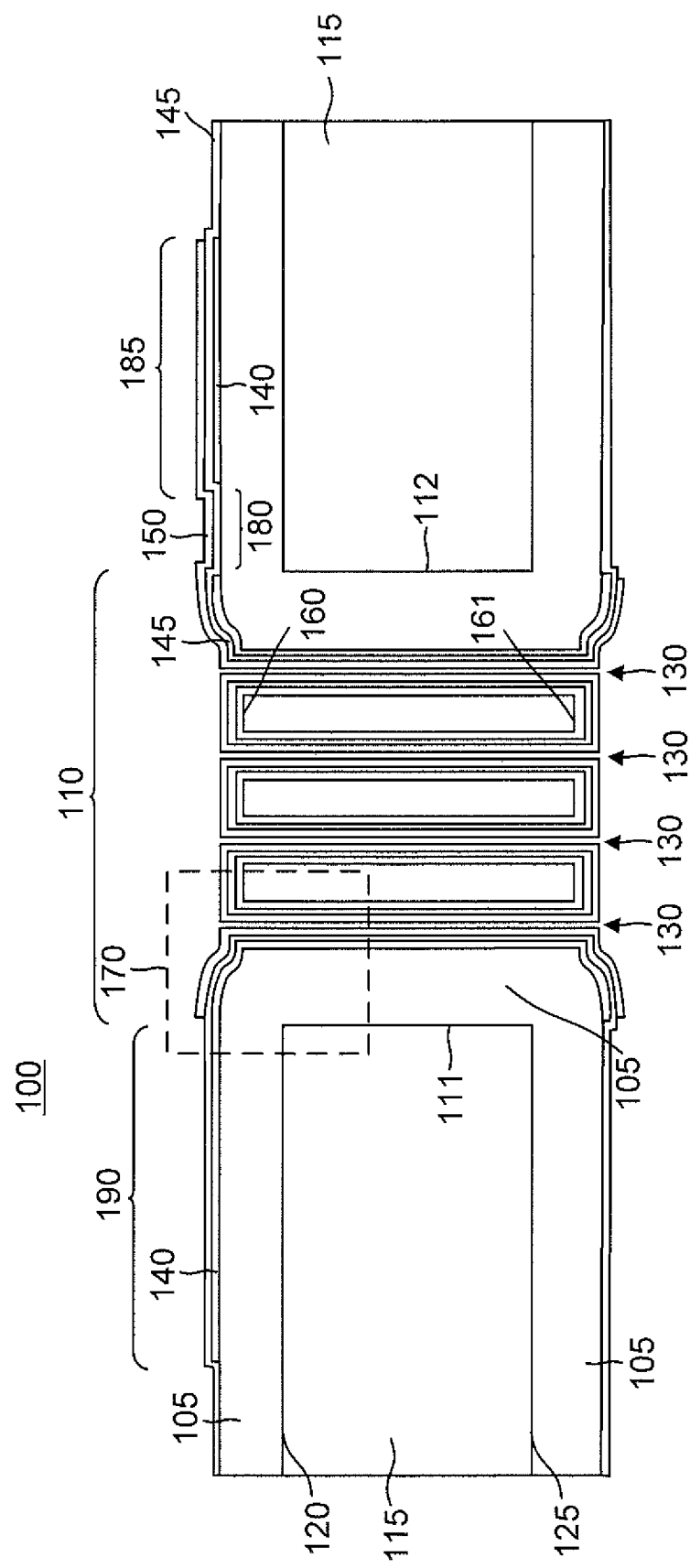
FIG. 1A is a cross-sectional view of a substrate including an embedded capacitor in accordance with an embodiment of the disclosure.

An embedded capacitor is disclosed that requires no surface mounting and does not require a substrate cavity because the embedded capacitor is formed within a dielectric-filled window or opening in the substrate. The window extends from a first side of the substrate to an opposing second side. The embedded capacitor comprises a metal-insulator-metal (MIM) structure deposited on vias extending from a first side of the dielectric material within the window to an opposing second side of the dielectric material within the window. Not only does the MIM structure line the vias, it also covers at least partially the first and second surfaces of the dielectric material within the window. The first and second surfaces of the substrate and the dielectric material form planes that may be defined using two Cartesian directions. Since the vias extend longitudinally in a third Cartesian direction that is orthogonal to the planes defined by the first and second of the dielectric material within the window, the resulting embedded capacitor may be denoted as a "three-dimensional" (3D) as it extends in all three Cartesian directions.

In contrast, a conventional capacitor formed using metal layers supported on a planar substrate surface may be denoted as "two-dimensional" (2D) in that the planar surface is defined by just two Cartesian dimensions. The use of vias in the disclosed embedded capacitors adds an orthogonal third dimension to the two dimensions defined by planar surfaces. For example, if the Cartesian x and y axes are used to define a planar surface, the vias would extend in a direction that is parallel with the z axis.

Overview

A wide variety of substrates may be used to support the embedded capacitor such as glass, semiconductor, and organic laminated substrates. The following discussion will be directed to a glass substrate embodiment since glass is inexpensive and has good rigidity but it will be appreciated that other types of substrates are also suitable. The resulting embedded capacitor solves a number of issues with regard to embedding a capacitor with a substrate. For example, there is a limit to the substrate thickness reduction that may be achieved with any substrate material in that a substrate become prone to warpage and other issues as it is excessively thinned. With regard to a glass substrate, the limit may be approximately 200 microns but that limit will vary depending upon the particular glass used in individual embodiments. As a substrate is thinned to such a limit, it becomes impractical to embed a conventional capacitor in that the capacitor to be embedded then has a height that is too large as compared to the reduced thickness of the substrate. In contrast to these problems with conventional embedded capacitors, the disclosed capacitors are readily embedded into substrates regardless of the substrate thickness or relative thinness.

Not only are substrates being thinned to reduce the resulting package height, the footprint or surface area occupied by a substrate is also an issue in modern devices. In general, it is desirable to decrease the substrate footprint as much as possible. But that means that the footprint for any capacitor embedded within such a substrate must be reduced accordingly. Since it is becoming difficult to embed capacitors in substrate cavities as the substrate thickness is reduced, an alternative is to coat a portion of the substrate surface with a metal-insulator-metal (MIM) structure to form a two-dimensional planar capacitor as discussed above. But the reduced substrate area means that the available surface area or footprint that may be occupied by such a two-dimensional planar capacitor is reduced accordingly.

The footprint or surface area of the MIM structure in a two-dimensional MIM capacitor determines the available capacitance such that as the footprint is reduced, the capacitance for the resulting MIM capacitor is reduced accordingly. Thus, a two-dimensional MIM capacitor is hampered in the amount of capacitance that can be offered as the available substrate footprint is reduced. But the disclosed 3-dimensional capacitors exploit the surface area provided by MIM-structure-lined vias to provide increased capacitance in a relatively small footprint. As will be explained further herein, one factor that affects the available via surface area (and hence the capacitance of a MIM structure lining each via) is the via aspect ratio. Regardless of what the minimum thickness is for a particular substrate embodiment, that minimum thickness presents a problem with regard to forming high-aspect ratio vias. The aspect ratio for a via is the ratio of the via's length to its width. Current technology limits the via diameter to be no less than approximately 40 to 50 microns for a 200 micron thick glass substrate in some embodiments. So the aspect ratio for such vias would range from five to four. But the disclosed embedded capacitor enables the formation of vias with greater aspect ratios in some embodiments (having a smaller via diameter in comparison to its length) that is advantageous in boosting the capacitance of the resulting 3-D embedded capacitor.

To achieve high capacitance using MIM-structure-lined vias, the substrate may be trepanned or machined to form a suitably-sized window or aperture that is then filled with a dielectric material such as a dielectric polymer material. In contrast to glass and other substrates such as semiconductor substrates, high-aspect ratio vias are readily formed in the dielectric material filling the substrate window. The vias may have a substantially circular cross section. Alternatively, each via may be elongated so as to form high-aspect ratio trenches or to have other non-circular cross-sections. Regardless of whether circular vias, trench-shaped vias, or other types of perforations are formed in the dielectric material, the resulting vias perforate through the dielectric material filling the substrate window. Since the dielectric material fills the window, it has a first surface and an opposing second surface within the window. Thus, the vias (or trenches or other types of perforations) in the dielectric material filling the substrate window extend from the dielectric material's first surface to the opposing second surface.

The metal-insulator-metal (MIM) structure lines the vias and extends over the first and second surfaces of the dielectric polymer. In addition, the metal-insulator-metal structure may be extended so as to be adjacent the first and second surfaces of the substrate outside a perimeter of the substrate window. The resulting embedded 3D-capacitor thus comprises the MIM structure. This is quite advantageous because the vias may be formed with relatively high aspect ratios such that the MIM structure has a relatively large amount of surface area. In contrast, a planar 2D capacitor formed using an MIM structure covering the space occupied by the dielectric-filled window has only the surface area defined by the window footprint.

For example, suppose the window surface area is 400 microns by 400 microns (160,000 square microns). A planar MIM structure covering such a surface area to form a two-dimensional capacitor and having a capacitance density of 20 nF/square millimeter would provide 3.2 nF of capacitance. But the embedded three-dimensional capacitor disclosed herein not only has twice this surface area but also the surface area defined by the walls of the various vias or trenches in the dielectric polymer. For instance, suppose that a 400 micron× 400 micron dielectric-filled window includes 100 vias, each being 20 microns in diameter. If the same MIM structure just described to form the two-dimensional capacitor is then deposited into the vias in the dielectric-material-filled window and also to cover both the first and second surfaces of the dielectric material, the resulting capacitance is approximately 15.2 nF—an increase of nearly five times over the comparable 2D MIM capacitor that occupies the same surface area. The three-dimensionality of the disclosed embedded capacitor thus offers considerable increases in capacitance as compared to a planar MIM capacitor occupying the same footprint.

The advantage of high-aspect ratio vias may be better appreciated with regard to the following example, which assumes a square-shaped dielectric-filled window in the substrate. To make the example even more generic, the four sides to the square-shaped window will be assumed to be a single unit in length each. Moreover, the substrate thickness is also assumed to be a single unit in length. One could conceivably fit one single via in such a square-shaped window that would have a surface area of $\pi$. Now suppose that the same square-shaped window instead included four vias, each having a width of $\frac{1}{4}$ a unit dimension. The surface area for these four vias would equal $2\pi$. Similarly, suppose that the same square-shaped window instead included one hundred vias, each having a width of $\frac{1}{10}$ a unit dimension. The surface area for these one hundred vias would equal $10\pi$. One can see that the surface area for n vias (as compared to just a single relatively-large via) in this square-shaped window increases proportionally to the square root of n, where n is an arbitrary plural integer indicating the number of vias. The via surface area thus goes up dramatically as more and more vias are introduced into the dielectric-filled substrate window. For example, if one hundred vias are used instead of one-relatively large via, the surface area goes up by an order of magnitude. Of course, one must make the via diameters narrower and narrower to introduce more and more vias into the dielectric-filled substrate window. The narrower the via diameter versus its length, the greater the aspect ratio for the via. Thus the use of a dielectric-filled window in a substrate as disclosed herein is quite advantageous because the achievable aspect ratio for the vias is much greater as compared to through-substrate vias such as through-glass vias. The increased surface area provided by a plurality of relatively high-aspect ratio vias leads to an increased surface area for the metal-insulator-metal structure because it lines the vias. As the surface area of the metal-insulator-metal structure is increased, its capacitance increases accordingly. The embedded 3D capacitor disclosed herein thus achieves high capacitance without requiring any expensive and impractical formation of cavities in the substrate that must then receive an embedded capacitor. Moreover, the embedded 3D capacitor is not surface mounted and thus does not affect the resulting package height. These advantages and additional features may be better appreciated with regard to the following example embodiments.

Example Embodiments

Turning now to the drawings, FIG. 1A shows a cross-sectional view of a three-dimensional capacitor 100 embedded in a substrate 115 in accordance with an embodiment of the disclosure. In particular, capacitor 100 embeds within a window or opening 110 in substrate 115. Window 110 extends through substrate 115 from a first surface 120 of substrate 115 to a second surface 125 of substrate 115. Because window 110 extends entirely through substrate 115, it includes sidewalls 111 and 112 that are substantially orthogonal to surfaces 120 and 125. Dielectric material 105 fills window 110 such that substrate surfaces 111 and 112 are in contact with dielectric material 105, which may comprise a dielectric polymer such as polymide, Ajinomoto build-up film, benzocyclobutene-based polymer, or other suitable dielectric materials. Substrate 115 may comprise glass, semiconductor, or other types of suitable substrates such as an organic substrate. To fill window 110, dielectric material 105 may be laminated over first surface 120 and opposing second surface 125 of substrate 115. In some embodiments, dielectric material thus not only fills window 110 from surfaces 111 to 112 but also covers surfaces 120 and 125. Within window 110, dielectric material 105 has a surface 160 and an opposing surface 161. Surfaces 160 and 161 are better illustrated in FIG. 5, which shows dielectric material 105 within window 110 prior to formation of any vias. FIG. 5 is discussed further below with regard to an example method of manufacture.

Referring again to FIG. 1A, a plurality of vias 130 extend through dielectric material 105 within window 110 from surface 160 to opposing surface 161. Each via 130 thus extends longitudinally in a direction that is substantially parallel to surfaces 111 and 112 and substantially orthogonal to surfaces 120 and 125.

Figure 1B:
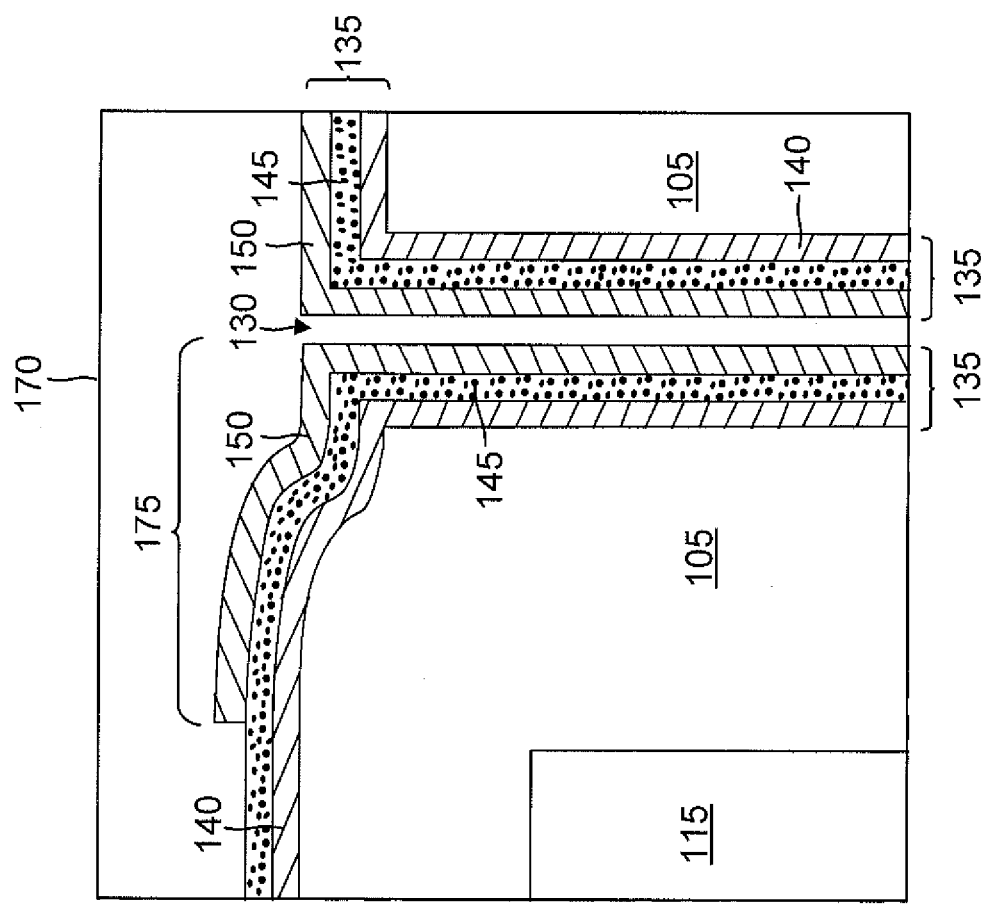
FIG. 1B is a close-up view of a portion of the embedded capacitor of FIG. 1A.

A metal-insulator-metal (MIM) structure 135 lines vias 130 as shown in FIG. 1B, which is an enlarged view of a portion 170 of embedded capacitor 100. MIM structure 135 comprises a first electrode layer 140 insulated by a dielectric layer 145 from a second electrode layer 150. In alternative embodiments, additional electrode layers and dielectric layers may be used in addition to layers 140, 145, and 150. Electrode layers 140 and/or 150 may be formed from metal such as through an electroless deposition of copper or nickel or may be formed from other conductive materials such as titanium nitride (TiN). A titanium nitride electrode layer may be formed using an atomic layer deposition (ALD) process or other suitable process. MIM structure 135 not only lines vias 130 but also at least partially lines or overlays surfaces 160 and 161 of dielectric material 105 within window 110. In other words, at least a portion of MIM structure 135 may be perpendicular to surfaces 120 and 125 of substrate 115 (e.g., the electrodes of MIM structure 135 may be perpendicular to surfaces 120 and 125). In contrast, the portions of MIM structure 135 lining vias 130 are parallel to surfaces 120 and 125. In addition to at least partially lining surfaces 160 and 161 of dielectric material 105, MIM structure 135 may also extend outside of window 110. For example, as seen in FIG. 1B, a portion 175 of MIM structure 135 could be extended laterally in alternative embodiments to overlay a portion of substrate 115.

The advantages of dielectric-filled window 110 may be better appreciated with reference again to FIG. 5, which shows surfaces 160 and 161 of dielectric material 105. MIM structure 135 (shown in FIG. 1B) may cover all or a portion of surfaces 160 and 161 in addition to lining vias 130. Thus, capacitor 100 not only enjoys the surface area obtained by lining vias 130 but also from covering those portions (or all) of surfaces 160 and 170 within window 110. A conventional MIM capacitor has only the surface area provided by its footprint on a substrate surface. In contrast, MIM capacitor 100 not only uses surfaces 160 and 161 of dielectric material 105 but also uses the surface area obtained by lining vias 130. This via surface area can be quite significant. As discussed earlier, the surface area for a plurality of n vias (n being a positive integer) may be the square root of n times larger as compared to the surface area obtained from using a single larger via. Increasing the number of vias 130 within dielectric window 110 thus increases the surface area for MIM structure 135 and the resulting capacitance for capacitor 100. But as the number of vias 130 is increased (without increasing the size of window 110), the aspect ratio for each via 130 must be increased accordingly. The use of a dielectric-filled window such as window 110 is quite advantageous because vias 130 may be formed so as to have such a relatively high aspect ratio. In contrast, the formation of conventional vias directly through a glass, semiconductor, or organic substrate (in contrast to forming vias 130 in dielectric material 105) typically requires a much lower aspect ratio. Thus, capacitor 100 may have a relatively high amount of capacitance despite a relatively small footprint for window 110. This is quite advantageous with regard to increasing density in the resulting electronic system that will incorporate capacitor 100.

To couple external circuits to capacitor 100, it will be appreciated that such external circuits need some form of interconnection to electrode layer 140. Similarly, an interconnection may be formed to electrode layer 150. There are numerous ways to make such interconnections. For example, MIM structure 135 may include a portion 185 that extends outside a perimeter of window 110 over surface 120 and away from surface 112 of substrate 115. Electrode layer 150 is the electrode layer furthest from substrate 115 and is directly exposed in portion 185. A pad or other type of interconnection (not illustrated) may thus contact electrode layer 150 in portion 185 to form a first terminal to capacitor 100. But note that portion 185 of MIM structure 135 would thus add capacitance to capacitor 100. In some embodiments, this extra capacitance may be undesirable. Thus, first electrode layer 140 may include a gap 180 in one embodiment such first electrode layer 140 in portion 185 is electrically isolated from the remaining portions of first electrode layer 140. Portion 185 of MIM structure 135 thus provides no contribution to the capacitance of embedded capacitor 100 since the first electrode layer 140 is electrically isolated in this portion due to gap 180. Similarly, first electrode layer 140 may include a portion 190 that extends outside a perimeter of window 110 over surface 120 and away from surface 111 of substrate 115. Electrode layer 150 does not extend over portion 190 such that a pad or other type of interconnection (not illustrated) may extend through dielectric layer 145 so as to contact electrode layer 140. In this fashion, interconnections may be made to both electrode layer 140 and electrode layer 150.

Figure 2:
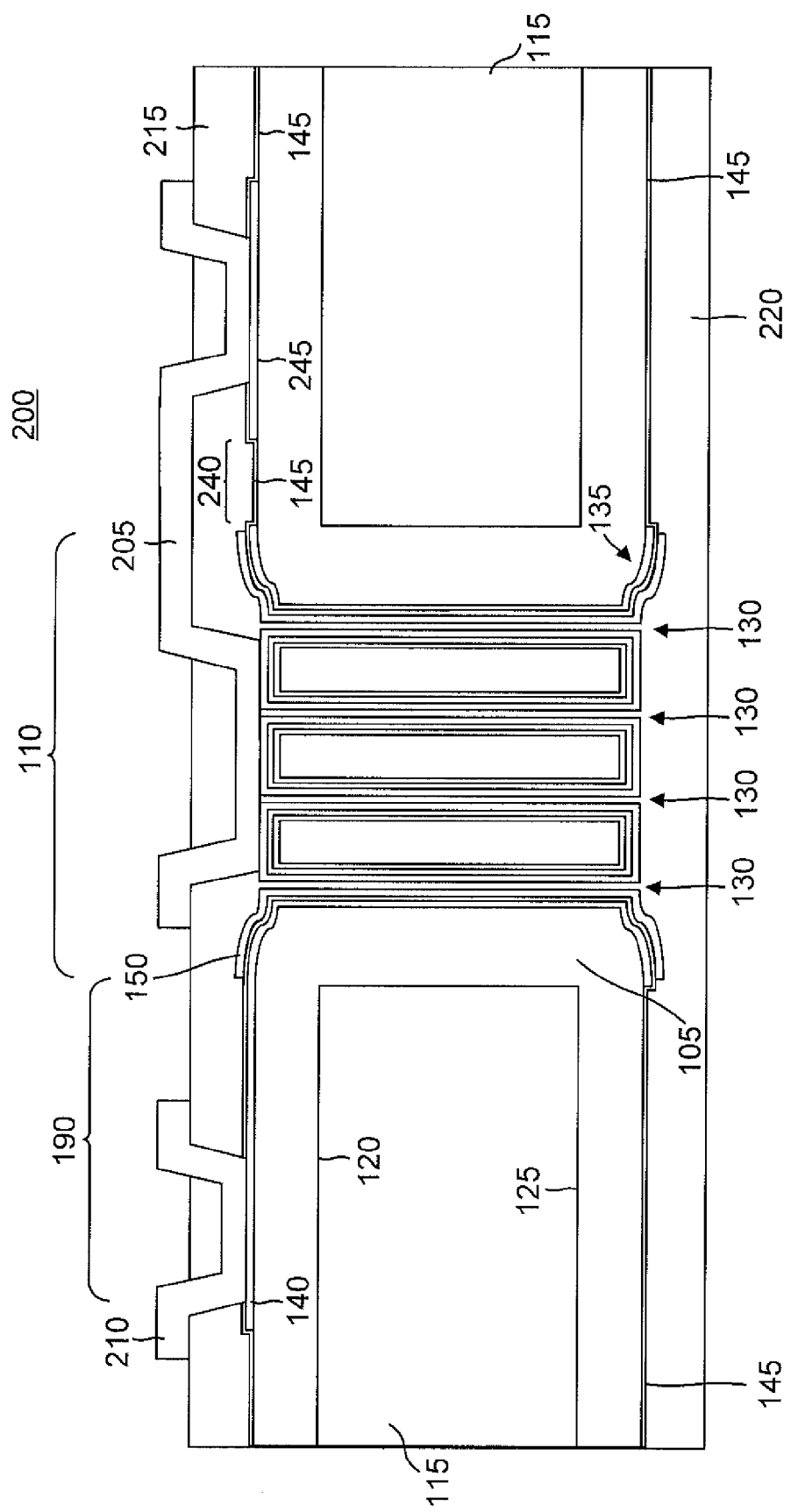
FIG. 2 is a cross-sectional view of a substrate including an embedded capacitor, wherein the substrate includes a metal layer configured to form interconnections to the embedded capacitor in accordance with an embodiment of the disclosure.

An alternative interconnection embodiment is shown in FIG. 2 for an embedded capacitor 200, which includes a patterned third electrode layer to form interconnections 205 and 210 to MIM structure 135. First electrode layer 140 includes portion 190 overlaying surface 120 outside of window 110 as discussed with regard to embedded capacitor 100. Interconnection 210 couples to electrode layer 140 in portion 190 to provide a first coupling or terminal to embedded capacitor 200. In addition, both electrode layers 140 and 145 are absent from a gap 240. Interconnection 205 extends over gap 240 to contact electrode layer 150 within window 110. Interconnection 205 also extends over surface 120 outside of window 110 to provide room for a pad formation with regard to a metal layer trace 245. Gap 240 isolates capacitor 200 from metal layer trace 245 so that its capacitance may be advantageously defined with some precision. An additional dielectric or passivation layer 215 and layer 220 covers MIM structure 135 and extends to cover portions of dielectric material 105 outside of window 110. Interconnections 210 and 205 may be electrodeposited so as to be relatively thick. This is advantageous as other device interconnections such as bumps or solder balls may in turn couple more securely to such a relatively-thick metal layer such as interconnections 210 and 205. It will be appreciated that interconnects 210 and 205 may be considered to form a means for coupling to first to embedded capacitor 200.

Figure 3:
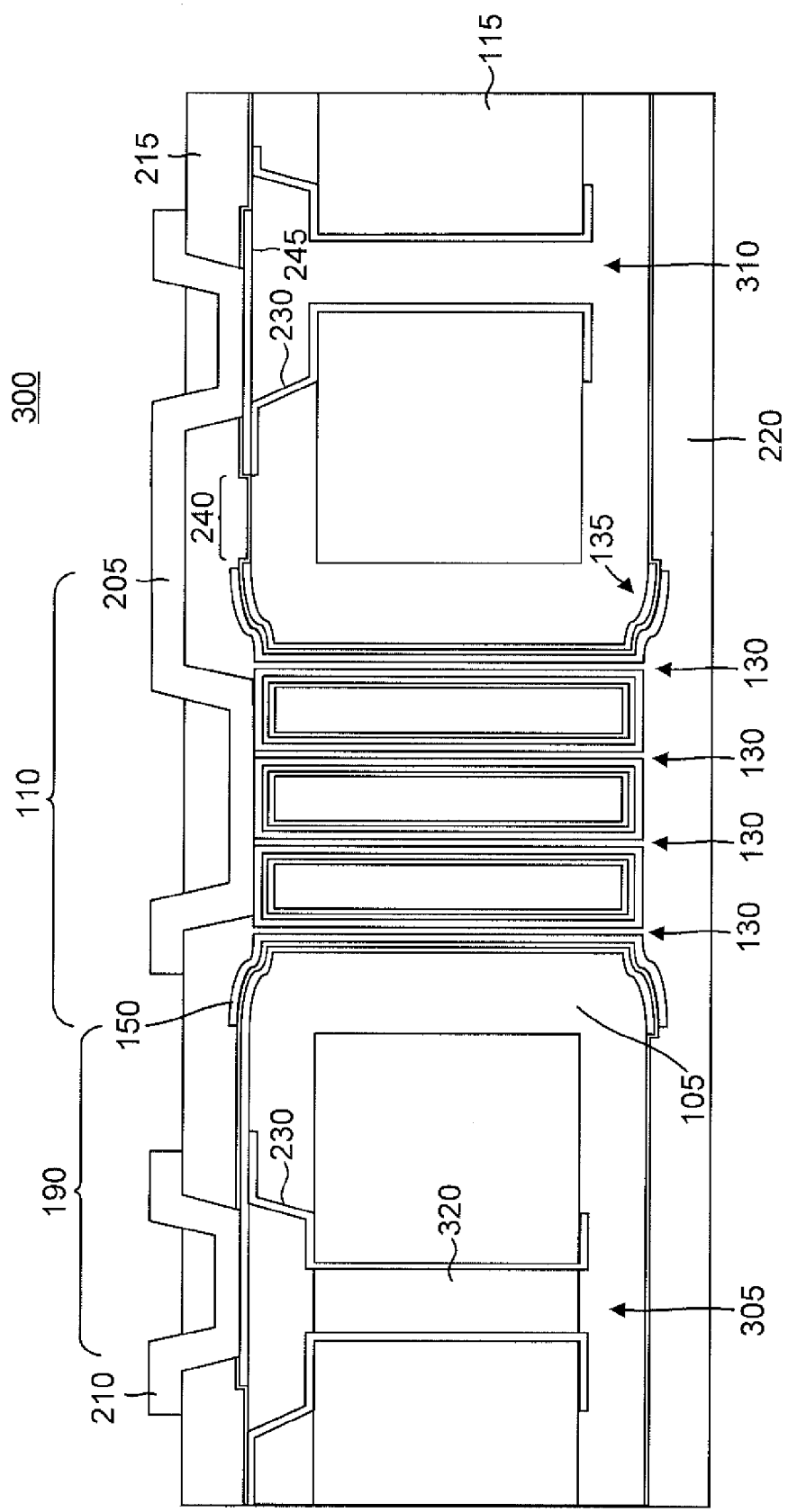
FIG. 3 is a cross-sectional view of a substrate including an embedded capacitor, wherein the substrate includes a metal layer configured to form interconnections to the embedded capacitor and further includes through-substrate vias in accordance with an embodiment of the disclosure.

Substrate 115 for the various embedded capacitor embodiments may be surface mounted on, for example, a printed circuit board through a plurality of solder balls (not illustrated) adjacent surface 125. Similarly, additional circuit components such as die(s) or other substrates (not illustrated) may be surface mounted on substrate 115 adjacent surface 120. To couple signals between the printed circuit board (or other mounting for substrate 115) to these additional circuit component, substrate 115 may include one or more through-substrate vias. An example embodiment is shown in FIG. 3, which shows substrate 115 supporting a capacitor 300 and including a through-substrate via 305 and a through-substrate via 310. In one embodiment, through-substrate via 305 is filled with metal 320 whereas through-substrate via 310 is not. A metal layer 230 lines vias 305 and 310 to make connections to additional traces (not illustrated) on substrate 115. The filling of through-substrate via 305 with metal 320 is useful, for example, in areas that require additional heat conductivity. The additional features for embedded capacitor 300 are as discussed with regard to embedded capacitor 200. But it will be appreciated that the inclusion of through-substrate vias is independent of the particular interconnections made to electrode layers 150 and 140. Some example methods of manufacture for various embedded capacitor embodiments will now be discussed.

It will be appreciated that the figures are not drawn to scale such that the relative thicknesses of layers 140, 145, and 150 may be quite different in some embodiments. For example, first electrode layer 140 may be relatively thick such as 0.5 to several microns in thickness. Such a relatively robust thickness is advantageous with regard to forming an interconnection to electrode layer 140 in portions 190 shown in FIGS. 1 and 2. In contrast, dielectric layer 145 may be relatively thin such as just tens to a few thousand angstroms in thickness so as to enhance the achievable capacitance between first electrode layer 140 and second electrode layer 150. Similarly, second electrode layer 150 may be relatively thin to enhance the accuracy and precision of its footprint over first electrode layer 140, which in turn determines the overall capacitance of embedded capacitor. For example, second electrode layer 150 may be just 1000 to 5000 angstroms in thickness in some embodiments. Some example methods of manufacture will now be discussed.

Example Methods of Manufacture

Figure 4B:
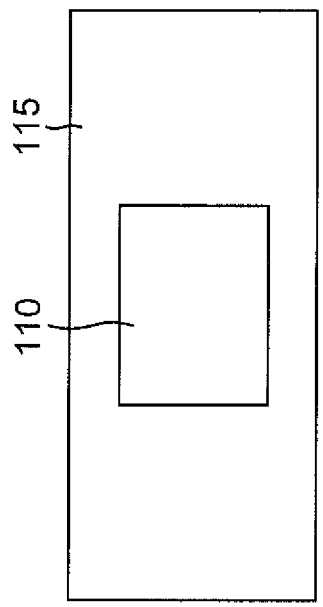
FIG. 4B if a plan view of the substrate of FIG. 4A after the window has been trepanned.
Figure 4A:
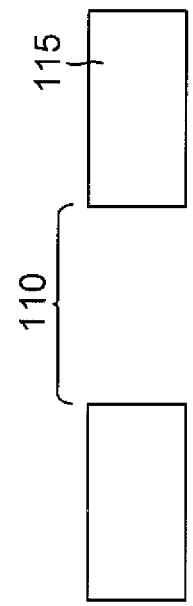
FIG. 4A is a cross-sectional view of a substrate during the trepanning of a window.

The formation of an embedded capacitor embodiment may begin as shown in FIG. 4A by laser drilling, machining, or etching the outlines of window 110 in substrate 115. A substrate portion 400 is thus removed from substrate 115 by, for example, a laser trepanning process to form window 110 as shown in FIG. 4B. Dielectric material 115 such as a dielectric polymer material may then be deposited over both sides 120 and 125 of substrate 115 so as to fill window 110 with dielectric material 105. For example, as shown in FIG. 5, a dielectric polymer may be laminated over both sides 120 and 125 of substrate 115 to fill window 110. Dielectric polymer suitable for such lamination includes polymide, Ajinomoto build-up film, or benzocyclobutene-based polymer. A plurality of vias 130 may then be mechanically or laser drilled through dielectric material 105 within window 110 as shown in FIGS. 4A and 4B. Vias 130 may each have a circular circumference in FIG. 6B. Alternatively, vias may have a variety of other shapes as discussed further below. The particular shape of the vias perforating dielectric material 105 within window 110 is not critical and may be widely varied depending upon the particular via formation process and type of dielectric material 105.

In one embodiment, vias 130 may have a diameter of 20 to 25 microns whereas substrate 115 may have a thickness of 200 microns. The aspect ratio for vias 130 (length to width) may thus be relatively high such as at least 5 in some embodiments or even 10 and greater. In contrast, one could not obtain such an advantageously-high aspect ratio if vias 130 were formed in a window-less substrate due to the relative ease of via formation in dielectric material 105 as compared to forming vias in substrate 115. For example, if substrate 115 comprises glass of 200 microns in thickness, the minimum diameter for vias 130 would be approximately 40 to 50 microns. The use of a dielectric-filled window 110 is thus quite advantageous with regard to enhancing the achievable capacitance for the resulting embedded capacitor. Because vias 130 may have a relatively narrow diameter, window 110 may include a relatively large number of them. In such a large aggregate, vias 130 thus have a relatively large amount of surface area as discussed earlier.

Figure 7:
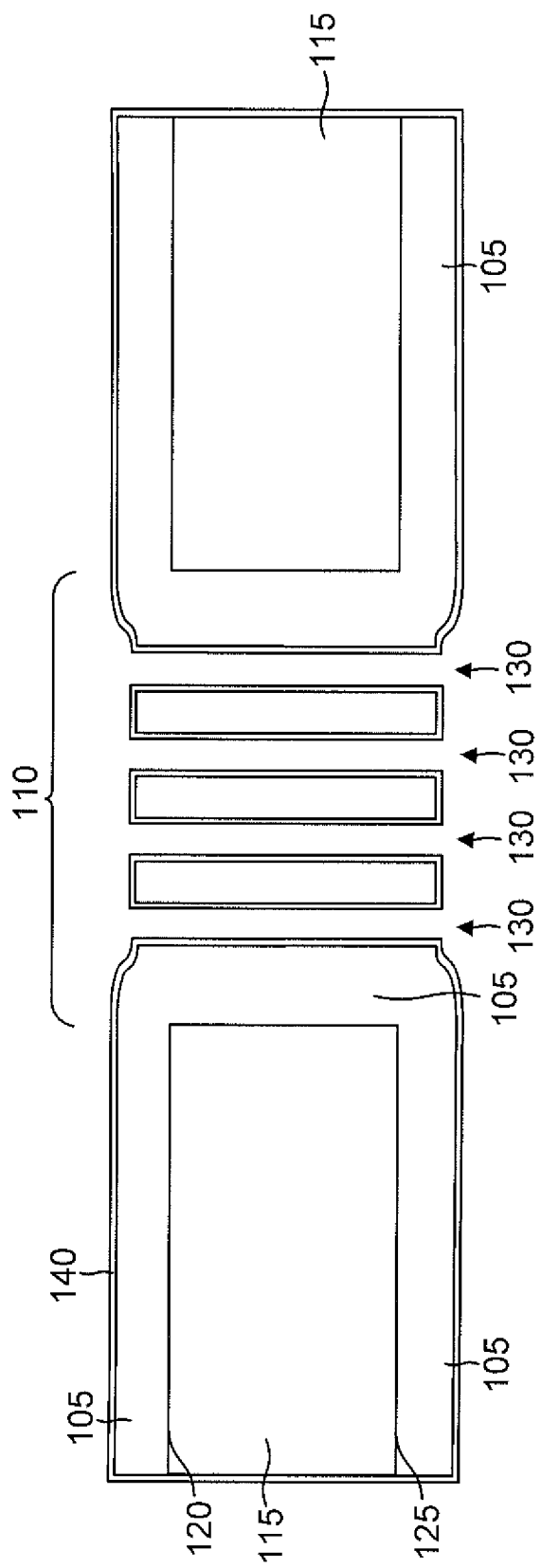
FIG. 7 is a cross-sectional view of the substrate of FIG. 6B after deposition of a first electrode layer.

First electrode layer 140 may then be deposited over the dielectric material 105 covering surfaces 120 and 124 of substrate 115 and also so as to line vias 130 and cover the surfaces of dielectric material 105 within window 110 as shown in FIG. 7. For example, an electroless deposition process may be used to deposit copper or nickel to form first electrode layer 140. As discussed earlier, first electrode layer 140 may be deposited so as to be relatively thick such as from 0.5 micron to several microns in thickness in some embodiments. Such a relatively robust thickness is advantageous with regard to forming interconnections to electrode layer 140 such as discussed with regard to portion 190 in FIG. 1A. Electrode layer 140 may also be patterned to define an outer perimeter of the resulting embedded capacitor. Alternatively, substrate 115 may be masked prior to deposition of first electrode layer 140. Electrode layer 140 may comprise copper, nickel, or other suitable metals. Note that metal is more readily deposited onto dielectric material 105 as opposed to a substrate material such as glass. This is yet another advantage of the use of dielectric-filled window 110 with regard to forming an embedded capacitor.

Figure 8:
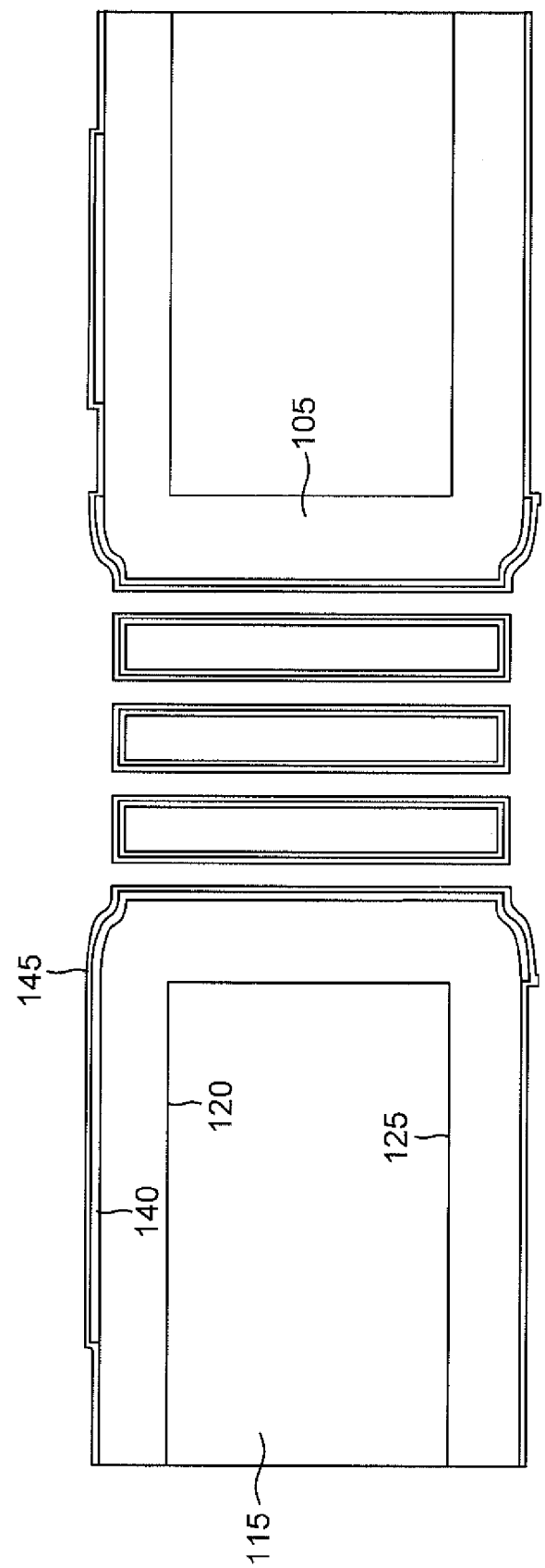
FIG. 8 is a cross-sectional view of the substrate of FIG. 7 after patterning of the first electrode layer and deposition of a dielectric layer.

Dielectric layer 145 may then be deposited onto first electrode layer 140 and also patterned as necessary as shown in FIG. 8. For example, an atomic layer deposition (ALD) process may be used to deposit dielectric layer 145 with regard to both surfaces 120 and 125 of substrate 115. A wide variety of dielectric material may be deposited in this fashion such as $Al_2O_3$, $Ta_2O_5$, $SiN_x$, $ZrO_2$, $Al_2O_3/ZrO_2$ sandwich, $SrTiO_3$, and $Ba_xSr_{1-x}TiO_3$. Although other techniques may be used, ALD is quite advantageous in that it covers all surfaces of electrode layer 140 with a uniform and precisely-controlled relatively thin layer. In general, a process that reliably deposits a dielectric layer 145 at a relatively small thickness is desirable because the capacitance is enhanced as the separation between electrode layers 140 and 150 is reduced. ALD and related processes reliably produce consistent dielectric layer thicknesses. Dielectric layer 145 may thus be tens to several hundred Angstroms or more in thickness in some embodiments.

Figure 9:
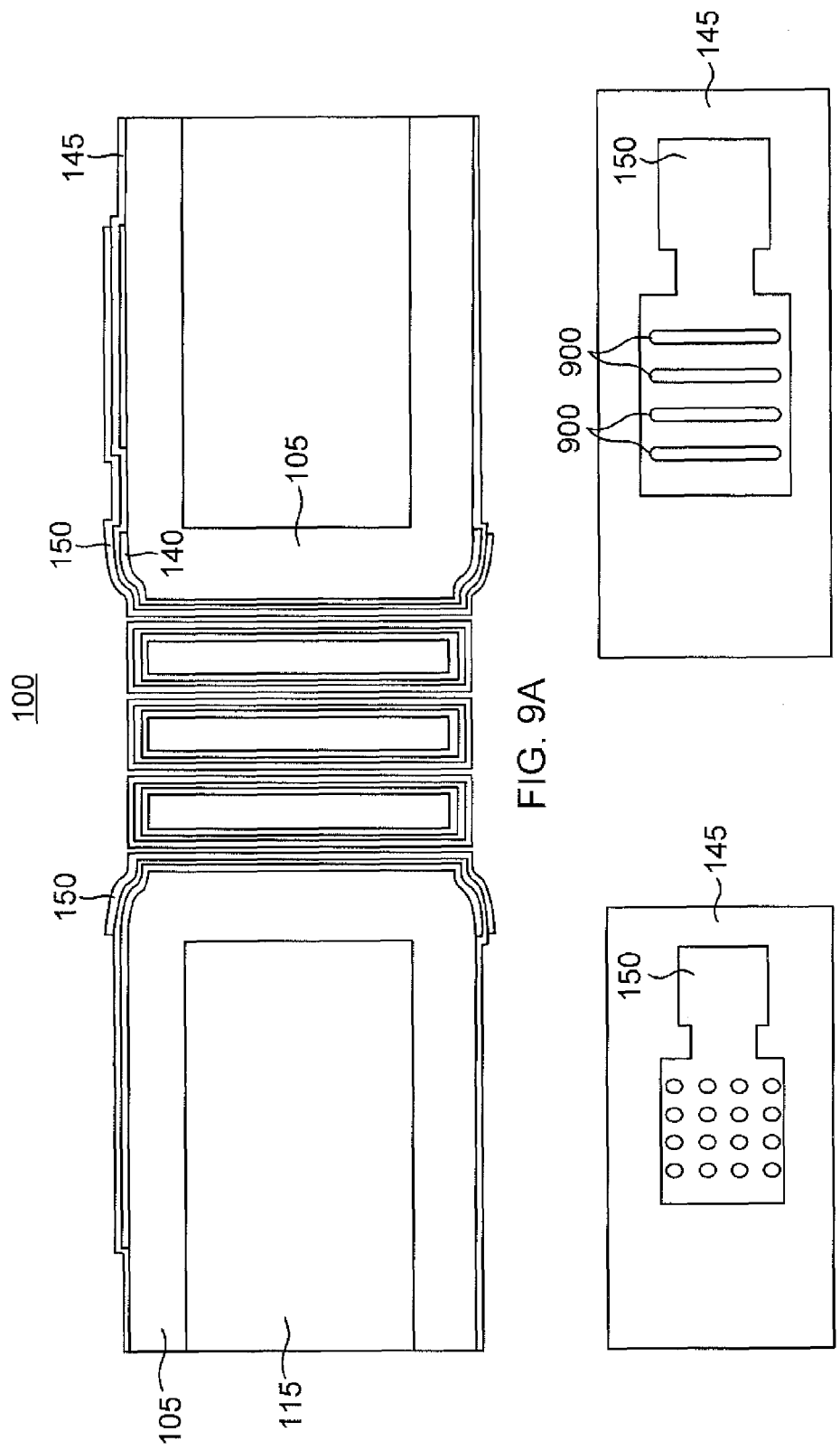
FIG. 9A is a cross-sectional view of the substrate of FIG. 9a after deposition and patterning of a second electrode layer.
FIG. 9B is a plan view of the substrate of FIG. 9A in an embodiment in which the vias are circular.
FIG. 9C is a plan view of the substrate of FIG. 9A in an embodiment in which the vias are trench-shaped.

Finally, second electrode layer 150 is deposited over dielectric layer 145 to complete embedded capacitor 100 as shown in FIG. 9A. For example, second electrode layer 150 may also be deposited using an electroless deposition process. Alternatively, second electrode layer may be electroplated or deposited using an atomic deposition process. The overlap of electrode layer 150 with regard to electrode layer 140 determines the resulting capacitance. Electrode layer 150 may thus be patterned as shown in FIG. 9B to a desired shape that determines the resulting capacitance. Since this patterning of electrode layer 150 is thus a determining factor in the resulting capacitance, electrode layer 150 may be deposited relatively thinly so as to enhance the precision of its subsequent patterning. For example, electrode layer 150 may be 1000 to 5000 Angstroms in thickness in some embodiments. As discussed with regard to electrode layer 140, electrode layer 150 may comprise copper, nickel, or other suitable metals. A third electrode layer such as a third metal layer (not illustrated) may then be deposited such as through electrodeposition and patterned to form interconnections (not illustrated) such interconnections 205 and 210 discussed with regard to FIGS. 2 and 3. Any through-substrate vias such as vias 305 and 310 of FIG. 3 may be manufactured using conventional substrate processing techniques.

Vias 130 need not have a circular circumference. For example, if vias 130 are laser drilled, the laser may be controlled such that the via diameters are shaped so as to form trenches 900 as shown in FIG. 9C. The implementation of trenches 900 is advantageous with regard to enhancing the resulting surface area to be covered by the MIM structure (not illustrated). Alternatively, the vias may be shaped so as to have polygonal cross-sections (not illustrated).

Figure 10:
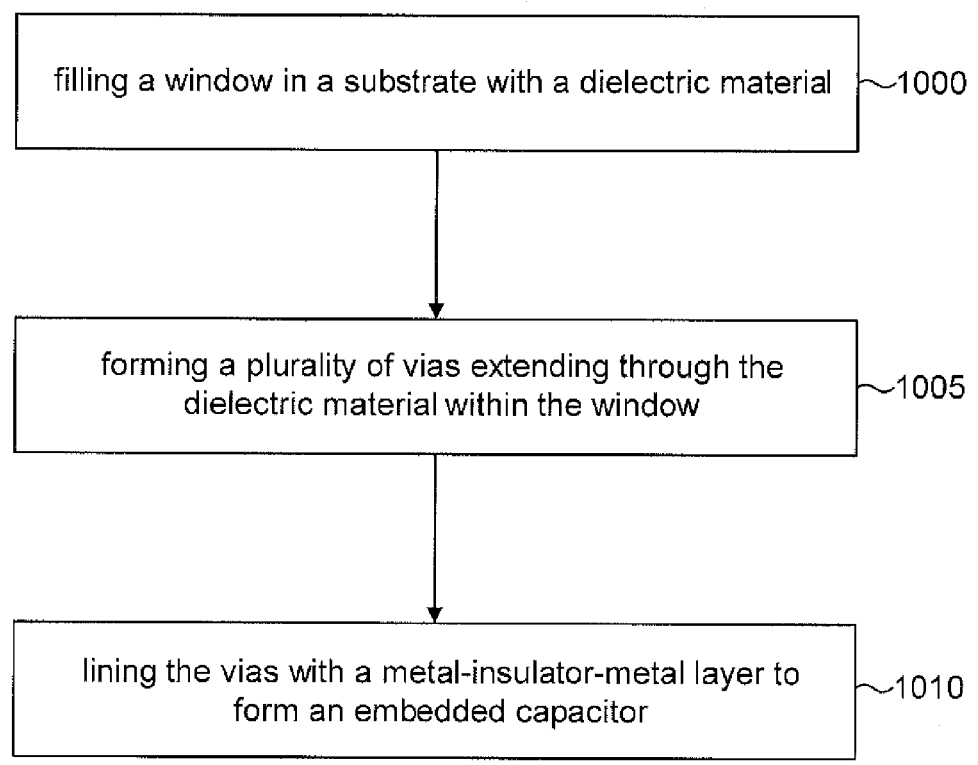
FIG. 10 is a flow chart for an example method of manufacturing the disclosed embedded capacitor.

The manufacturing process may be summarized as shown in the flowchart of FIG. 10. The process begins with a step 1000 of filling a window in a substrate with a dielectric material. The process continues with a step 1005 of providing a plurality of vias extending through the dielectric material within the window. Finally, the process includes a step 1010 of lining the vias with a metal-insulator-metal structure to form an embedded capacitor. Some example electronic systems that may advantageously include the embedded capacitors disclosed herein will now be discussed.

Example Electronic Systems

Figure 11:
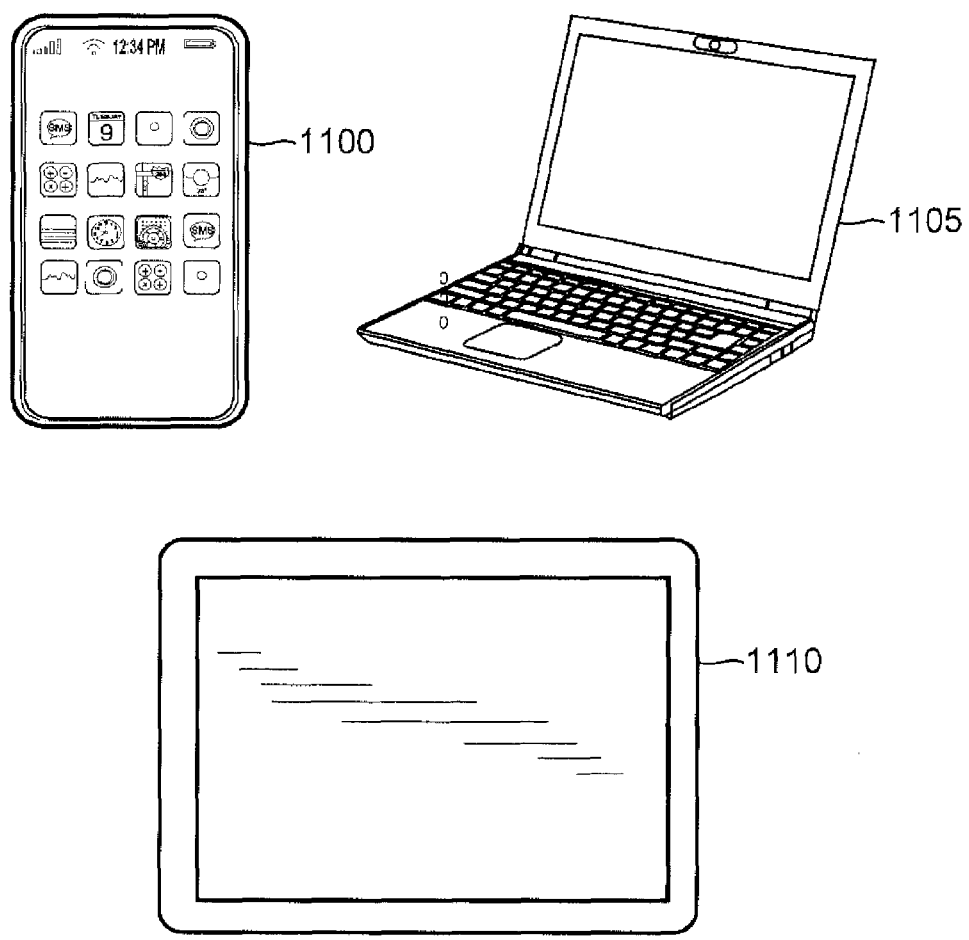
FIG. 11 illustrates some example electronic systems that may be configured to include the disclosed embedded capacitor.

A substrate including an embedded capacitor as disclosed herein may be incorporated into a wide variety of electronic systems. For example, as shown in FIG. 11, a cell phone 1100, a laptop 1105, and a tablet PC 1110 may all include an integrated circuit package incorporating an embedded capacitor constructed in accordance with the disclosure. Other exemplary electronic systems such as a music player, a video player, a communication device, and a personal computer may also be configured with integrated circuit packages including a substrate having an embedded capacitor constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A device, comprising:
    a substrate; a window extending through the substrate; a dielectric material within the window; a plurality of vias extending from a first side of the dielectric material to an opposing second side of the dielectric material; and a metal-insulator-metal (MIM) structure lining the vias and at least partially lining the first and second sides of the dielectric material, wherein an electrode layer in the MIM structure includes a gap outside of the window.

2. The device of claim 1, wherein the substrate comprises a glass substrate.

3. The device of claim 1, wherein the dielectric material comprises a dielectric polymer.

4. The device of claim 3, wherein the dielectric material is selected from the group consisting of polymide, Ajinomoto build-up film, and benzocyclobutene-based polymer.

5. The device of claim 1, wherein the vias have a circular cross-section.

6. The device of claim 1, wherein the vias have a trench-shaped cross section.

7. The device of claim 1, wherein the MIM structure includes a dielectric layer and a second electrode layer that extends over the gap.

8. The device of claim 1, further comprising:
    a first interconnect configured to contact the electrode layer in the MIM structure; and a second interconnect configured to contact a second electrode layer in the MIM structure, wherein the first interconnect is configured to contact the electrode layer outside of the window and the second interconnect is configured to contact the second electrode layer at a location inside of the window.

9. The device of claim 1, wherein the vias have an aspect ratio of at least four.

10. A method, comprising:
at least partially filling a window in a substrate with a dielectric material;
forming a plurality of vias extending through the dielectric material within the window; lining the vias with a metal-insulator-metal (MIM) structure to form an embedded capacitor; and depositing an electrode layer in the MIM structure, wherein forming the electrode layer includes forming a gap in the electrode layer, and wherein the gap is outside of the window.

11. The method of claim 10, wherein providing the plurality of vias comprises perforating the dielectric material from a first side of the dielectric material within the window to an opposing second side of the dielectric material within the window, the method further comprising coating the MIM structure at least partially over the first and second sides of the dielectric material.

12. The method of claim 11, wherein perforating the dielectric material comprises laser drilling the dielectric material.

13. The method of claim 12, wherein depositing the electrode layer comprises using an electroless deposition process.

14. The method of claim 13, wherein lining the vias and coating the first and second sides at least partially with the MIM structure further comprises depositing a dielectric layer on the electrode layer using an atomic deposition layer process.

15. The method of claim 14, wherein lining the vias and coating the first and second sides at least partially with the MIM structure further comprises depositing a second electrode layer on the dielectric layer using a process selected from the group consisting of an additional electroless deposition process, atomic deposition, and electroplating.

16. The method of claim 10, further comprising depositing a plurality of interconnects to couple to the embedded capacitor.

17. A device, comprising:
a substrate having a first surface and a second surface a window extending through the substrate from the first surface to the second surface; a dielectric material within the window, wherein the dielectric material includes a first surface that is substantially parallel to the first surface of the substrate and includes a second surface that is substantially parallel to the second surface of the substrate; a plurality of vias extending from the first side of the dielectric material to the second side of the dielectric material; a metal-insulator-metal (MIM) structure configured to line the vias and to at least partially cover the first and second surfaces of the dielectric material, wherein the MIM structure includes a first electrode layer and a second electrode layer, and wherein the first electrode layer includes a gap outside of the window; and means for interconnecting to the first electrode layer and to the second electrode layer.

18. The device of claim 17, wherein the substrate comprises glass.

19. The device of claim 17, wherein the substrate comprises silicon.

20. The device of claim 17, wherein the device is incorporated into at least one of a cellphone, a laptop, a tablet, a music player, a communication device, a computer, and a video player.

* * * * *